(12) United States Patent
Hara et al.

(10) Patent No.: US 10,381,487 B2
(45) Date of Patent: Aug. 13, 2019

(54) THIN FILM TRANSISTOR

(71) Applicant: Sharp Kabushiki Kaisha, Sakai, Osaka (JP)

(72) Inventors: Kengo Hara, Sakai (JP); Tohru Daitoh, Sakai (JP); Hajime Imai, Sakai (JP); Tetsuo Kikuchi, Sakai (JP); Masahiko Suzuki, Sakai (JP); Setsuji Nishimiya, Sakai (JP); Teruyuki Ueda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/142,082

(22) Filed: Sep. 26, 2018

(65) Prior Publication Data

US 2019/0103494 A1    Apr. 4, 2019

(30) Foreign Application Priority Data

Oct. 2, 2017 (JP) .................................. 2017-192484

(51) Int. Cl.
| | |
|---|---|
| *H01L 29/786* | (2006.01) |
| *H01L 29/49* | (2006.01) |
| *H01L 29/51* | (2006.01) |
| *H01L 29/423* | (2006.01) |
| *G02F 1/1368* | (2006.01) |
| *G02F 1/1362* | (2006.01) |
| *H01L 27/12* | (2006.01) |
| *H01L 29/24* | (2006.01) |

(52) U.S. Cl.
CPC .. *H01L 29/78648* (2013.01); *H01L 29/42364* (2013.01); *H01L 29/42384* (2013.01); *H01L 29/4908* (2013.01); *H01L 29/518* (2013.01); *H01L 29/7869* (2013.01); *H01L 29/78696* (2013.01); *G02F 1/1368* (2013.01); *G02F 1/136286* (2013.01); *H01L 27/124* (2013.01); *H01L 27/1225* (2013.01); *H01L 29/24* (2013.01); *H01L 29/513* (2013.01)

(58) Field of Classification Search
CPC ........... H01L 29/78648; H01L 29/7869; H01L 29/78693
See application file for complete search history.

(56) References Cited

U.S. PATENT DOCUMENTS 9,608,126 B1 * 3/2017 Hsu ...................... H01L 29/7869
9,705,004 B2 * 7/2017 Kobayashi .......... H01L 29/7869
(Continued)

FOREIGN PATENT DOCUMENTS

JP      2015-181151 A    10/2015

*Primary Examiner* — George R Fourson, III
(74) *Attorney, Agent, or Firm* — Keating & Bennett, LLP

(57) ABSTRACT

A thin film transistor includes a channel section formed from semiconductor material, a source electrode connected to one end of the channel section, a drain electrode connected to another end of the channel section, an upper gate electrode included in an upper layer than the channel section and overlapping the channel section, a lower gate electrode included in a lower layer than the channel section and overlapping the channel section, an upper gate insulation film disposed between the upper gate electrode and the channel section, and a lower gate insulation film disposed between the lower gate electrode and the channel section and having a film thickness relatively greater than that of the upper gate insulation film.

7 Claims, 7 Drawing Sheets

(56) References Cited

U.S. PATENT DOCUMENTS

| | | | | |
|---|---|---|---|---|
| 9,929,279 | B2 | 3/2018 | Yamazaki et al. | |
| 2010/0148171 | A1* | 6/2010 | Hayashi | H01L 21/28282 |
| | | | | 257/43 |
| 2011/0309353 | A1* | 12/2011 | Kaneko | H01L 27/0688 |
| | | | | 257/43 |
| 2013/0270552 | A1* | 10/2013 | Yamazaki | H01L 29/7831 |
| | | | | 257/43 |
| 2013/0299883 | A1* | 11/2013 | Lin | H01L 29/66969 |
| | | | | 257/288 |
| 2015/0053970 | A1* | 2/2015 | Lee | H01L 27/1225 |
| | | | | 257/43 |
| 2015/0214378 | A1* | 7/2015 | Matsubayashi | H01L 29/7869 |
| | | | | 257/43 |
| 2015/0221774 | A1* | 8/2015 | Yamazaki | H01L 29/7869 |
| | | | | 257/43 |
| 2016/0042806 | A1* | 2/2016 | Ogawa | G11C 19/28 |
| | | | | 345/205 |
| 2017/0062484 | A1* | 3/2017 | Hsu | H01L 27/1237 |
| 2017/0248128 | A1* | 8/2017 | Koyama | F03G 7/08 |
| 2017/0373193 | A1* | 12/2017 | Yamazaki | H01L 29/78648 |
| 2018/0166578 | A1* | 6/2018 | Yamazaki | H01L 21/02 |
| 2018/0190825 | A1 | 7/2018 | Yamazaki et al. | |
| 2018/0358475 | A1* | 12/2018 | Guo | H01L 29/78696 |
| 2019/0096748 | A1* | 3/2019 | Kuo | |

* cited by examiner

FIG.3

| | EXAMPLE 1 | EXAMPLE 2 | EXAMPLE 3 | EXAMPLE 4 | EXAMPLE 5 |
|---|---|---|---|---|---|
| FILM THICKNESS T2 OF UPPER GATE INSULATION FILM (SiO2) [nm] | 120 | 120 | 120 | 120 | 120 |
| FILM THICKNESS T1 OF LOWER GATE INSULATION FILM [nm] | 375 | 375 | 375 | 425 | 475 |
| FILM THICKNESS T4 OF SiO2 OF LOWER GATE INSULATION FILM [nm] | 50 | 100 | 150 | 100 | 150 |
| FILM THICKNESS RATIO OF SiO2 OF LOWER GATE INSULATION FILM [%] | 13.3 | 26.7 | 40.0 | 23.5 | 31.6 |
| FILM THICKNESS T3 OF SiN OF LOWER GATE INSULATION FILM [nm] | 325 | 275 | 225 | 325 | 325 |
| FILM THICKNESS RATIO OF SiN OF LOWER GATE INSULATION FILM [%] | 86.7 | 73.3 | 60.0 | 76.5 | 68.4 |
| $Cgi2 / (Cgi1 + Cgi2)$ | 0.665 | 0.684 | 0.700 | 0.706 | 0.738 |
| DRAIN CURRENT [A] | $6.842 \times 10^{-5}$ | $7.103 \times 10^{-5}$ | $7.131 \times 10^{-5}$ | $7.191 \times 10^{-5}$ | $7.669 \times 10^{-5}$ |

THIN FILM TRANSISTOR

CROSS REFERENCE TO RELATED APPLICATION

This application claims priority from Japanese Patent Application No. 2017-192484 filed on Oct. 2, 2017. The entire contents of the priority application are incorporated herein by reference.

TECHNICAL FIELD

The technology described herein relates to a thin film transistor.

BACKGROUND

A transistor, which is a kind of a semiconductor device, includes a first insulation layer, a second insulation layer, an oxide semiconductor layer, and first to third conductive layers. The oxide semiconductor layer includes a region in contact with the first insulation layer, the first conductive layer is connected to the oxide semiconductor layer, and the second conductive layer is connected to the oxide semiconductor layer. The second insulation layer includes a region in contact with the oxide semiconductor layer, and the third conductive layer includes a region in contact with the second insulation layer. The oxide semiconductor layer includes first to third regions. The first region and the second region are separated from each other and the third region is located between the first region and the second region. The third region and the third conductive layer overlap with each other with the second insulation layer located therebetween. The first region and the second region include a region having a higher carbon concentration than the third region. An example of such a semiconductor device is disclosed in Japanese Unexamined Patent Application Publication No. 2015-181151.

In such a semiconductor device, the third conductive layer is used as a gate electrode layer and a conductive layer is included on an opposite side from the third conductive layer side with respect to the oxide semiconductor layer. The conductive layer is used as a second gate electrode layer (a back gate). According to such a configuration, a drain current is to be increased. However, the oxide semiconductor layer includes oxide semiconductor material as the semiconductor material and charge mobility is lower and the drain current is smaller compared to the configuration using polysilicon as the semiconductor material. Therefore, if using the oxide semiconductor material instead of polysilicon, the drain current is required to be further increased.

SUMMARY

The technology described herein was made in view of the above circumstances and an object is to further increase drain current.

A thin film transistor according to the present technology includes a channel section formed from semiconductor material, a source electrode connected to one end of the channel section, a drain electrode connected to another end of the channel section, an upper gate electrode included in an upper layer than the channel section and overlapping the channel section, a lower gate electrode included in a lower layer than the channel section and overlapping the channel section, an upper gate insulation film disposed between the upper gate electrode and the channel section, and a lower gate insulation film disposed between the lower gate electrode and the channel section and having a film thickness relatively greater than that of the upper gate insulation film.

According to such a configuration, if current is supplied to the upper gate electrode and the lower gate electrode, charges move between the source electrode and the drain electrode through the channel section that is formed from the semiconductor material. The upper gate electrode and the lower gate electrode overlap the channel section. With such a configuration, the drain current flowing through the channel section is increased compared to a configuration in which only one gate electrode overlaps the channel section.

The width of the channel section is referred to as "W", the length of the channel section is referred to as "L", the voltage applied to the upper gate electrode is referred to as "Vg", the electrostatic capacitance between the channel section and the lower gate electrode is referred to as "Cgi1", and the electrostatic capacitance between the channel section and the upper gate electrode is referred to as "Cgi2". The drain current "Id" flowing through the channel section is represented by the formula of "Id≈W/2L·Cgi2·Cgi2/(Cgi1+Cgi2)·Vg$^2$". According to the formula, if each of the width "W" of the channel section, the length "L" of the channel section, and the voltage "Vg" applied to the upper gate electrode is constant, a ratio of the electrostatic capacitance "Cgi2/(Cgi1+Cgi2)" dominantly influences the drain current "Id". The thickness of the lower gate insulation film is relatively greater than that of the upper gate insulation film and therefore, the electrostatic capacitance "Cgi1" generated between the channel section and the lower gate electrode is smaller than the electrostatic capacitance "Cgi2" generated between the channel section and the upper gate electrode. Accordingly, the ratio of the electrostatic capacitance "Cgi2/(Cgi1+Cgi2)" is increased and as a result, the drain current "Id" is further increased.

According to the technology described herein, drain current can be further increased.

BRIEF DESCRIPTION OF THE DRAWINGS

FIG. 3 is a table illustrating experiment results of comparative experiment.

DETAILED DESCRIPTION

First Embodiment

Figure 1:
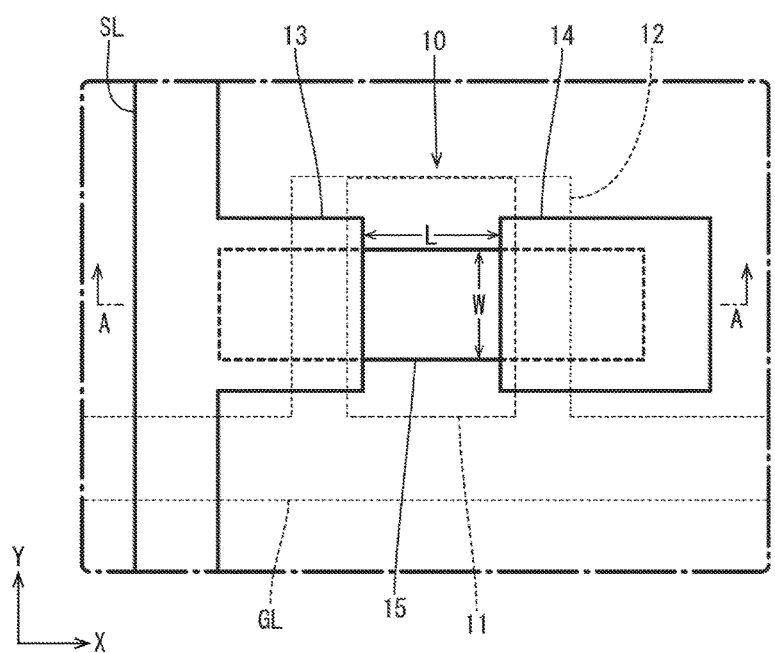
FIG. 1 is a plan view of a TFT according to a first embodiment of the present technology.

A first embodiment will be described with reference to FIGS. 1 to 4. In the embodiment section, a thin film transistor (TFT) 10 included in a liquid crystal panel (a display panel) will be described. X-axis, Y-axis and Z-axis may be indicated in the drawings. The axes in each drawing correspond to the respective axes in other drawings. An upper side and a lower side in FIG. 2 correspond to a front side and a back side, respectively.

The liquid crystal panel includes a liquid crystal layer between a pair of substrates. On a glass substrate GS of one of the substrates (an array substrate), the TFTs 10 that are switching components are arranged. The TFTs 10 control an alignment state of liquid crystal molecules included in the liquid crystal layer for each pixel. As illustrated in FIG. 1, the TFT 10 is arranged near a crossing point of a gate line GL and a source line SL arranged on the glass substrate GS of the one of the substrates. The gate line GL extends in the X-axis direction and scan signals are supplied to the TFT 10 through the gate line GL, and the source line SL extends in the Y-axis direction and image signals (data signals) are supplied to the TFT 10 through the source line SL. The TFT 10 is connected to the gate line GL, the source line SL, and a pixel electrode (not illustrated) included in a pixel and driven based on various kinds of signals supplied through the gate line GL and the source line SL. According to the driving of the TFT 10, potential supply to the pixel electrode is controlled.

Figure 2:
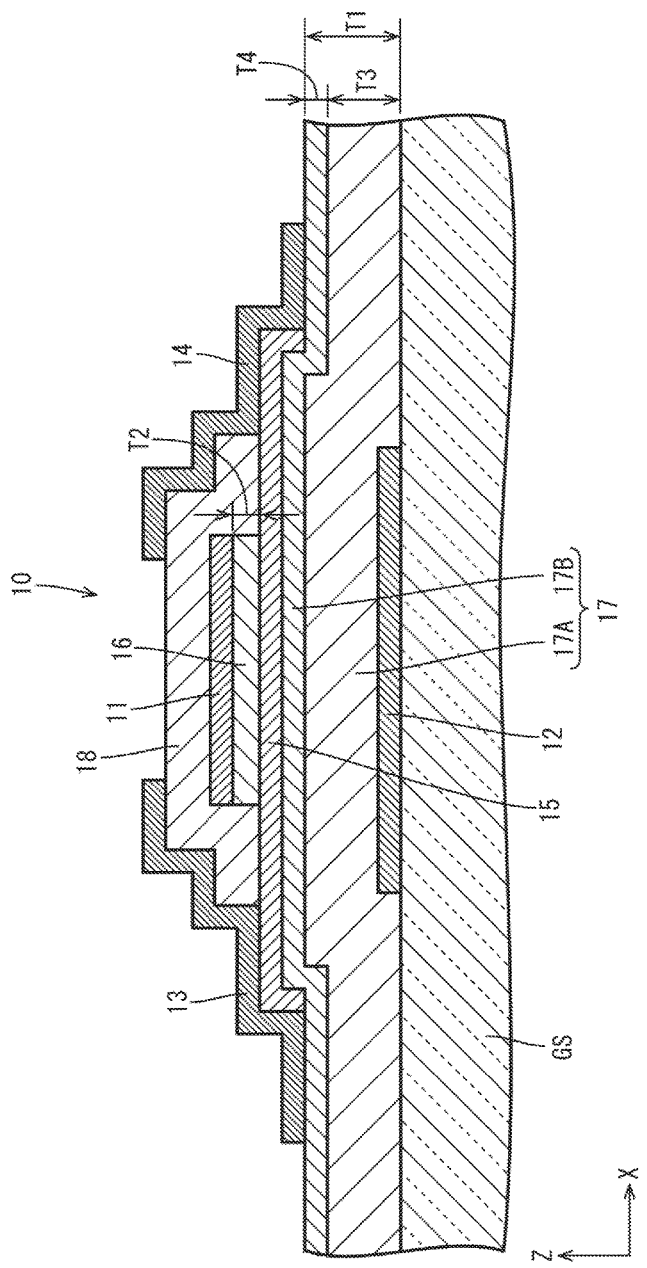
FIG. 2 is a cross-sectional view taken along line A-A in FIG. 1.

The TFT 10 will be described in detail. As illustrated in FIGS. 1 and 2, the TFT 10 at least includes an upper gate electrode 11 and a lower gate electrode 12 that are connected to the gate line GL, a source electrode 13 that is connected to the source line SL, a drain electrode 14 that is connected to the pixel electrode, and a channel section 15 that is connected to the source electrode 13 and the drain electrode 14. Further, the TFT 10 at least includes an upper gate insulation film 16 that is between the upper gate electrode 11 and the channel section 15 and a lower gate insulation film 17 that is between the lower gate electrode 12 and the channel section 15. The TFT 10 includes an interlayer insulation film 18 between the upper gate electrode 11 and each of the source electrode 13 and the drain electrode 14. Hereinafter, a configuration of the TFT 10 will be described sequentially from a lowest layer.

As illustrated in FIGS. 1 and 2, the lower gate electrode 12 is directly disposed on the glass substrate GS of the one substrate and included in a same layer as the gate line GL. The lower gate electrode 12 is branched from the gate line GL. The lower gate electrode 12 and the gate line GL are formed from a multilayer metal film including different kinds of metal material. For example, the multilayer metal film includes a lower metal film made of titanium (Ti) and an upper metal film made of copper (Cu). The lower gate insulation film 17 is disposed in a solid pattern over the glass substrate GS, which is the one substrate, and over the lower gate electrode 12 and establishes insulation between the lower gate electrode 12 and the channel section 15. As will be described later, the lower gate insulation film 17 has a multilayer structure including silicon compound layers. The channel section 15 is a semiconductor film formed of semiconductor material and disposed on the lower gate insulation film 17 (a silicon oxide layer 17B) while overlapping the lower gate electrode 12. The semiconductor material of the channel section 15 is oxide semiconductor material. A specific example of the oxide semiconductor material is In—Ga—Zn—O semiconductors (for example, indium gallium zinc oxide). The In—Ga—Zn—O semiconductors are ternary oxide of indium (In), gallium (Ga), and zinc (Zn), and the ratio (composition ratio) of In, Ga, and Zn is not particularly limited but may be In:Ga:Zn=2:2:1, In:Ga:Zn=1:1:1, or In:Ga:Zn=1:1:2. The In—Ga—Z—O semiconductors may be amorphous or crystalline having crystalline qualities. The oxide semiconductors having the crystalline qualities may preferably be crystalline In—Ga—Zn—O semiconductors where c-axis is oriented substantially vertical to a layer surface.

As illustrated in FIGS. 1 and 2, the upper gate insulation film 16 is disposed on the channel section 15 and establishes insulation between the upper gate electrode 11 and the channel section 15. The upper gate insulation film 16 is formed in an island form such that a plan view forming area thereof is substantially same as that of the upper gate electrode 11 and the forming area of the upper gate insulation film 16 differs from that of the lower gate insulation film 17 that is disposed in a substantially solid form. The upper gate insulation film 16 has a single layer structure of a silicon compound layer and specifically formed from a silicon oxide ($SiO_2$) layer. The upper gate electrode 11 is formed in a square island form in a plan view and overlaps, in a plan view, the channel section 15, the lower gate electrode 12, and the upper gate insulation film 16 of the same island form. The upper gate electrode 11 is a multilayer metal film similar to the lower gate electrode 12, and includes a lower metal film made of titanium (Ti) and an upper metal film made of copper (Cu). The upper gate electrode 11 is connected to the lower gate electrode 12 through a contact hole (not illustrated). According to such a configuration, the scan signal transmitted through the gate line GL is supplied to the upper gate electrode 11 and the lower gate electrode 12 at the same timing. The contact hole is formed in the upper gate insulation film 16 and the lower gate insulation film 17 that are present between the upper gate electrode 11 and the lower gate electrode 12. The interlayer insulation film 18 is disposed on the channel section 15 and the upper gate electrode 11 and establishes insulation between the upper gate electrode 11 and each of the source electrode 13 and the drain electrode 14. The interlayer insulation film 18 is formed in an island form having a plan view forming area that is larger than that of the upper gate electrode 11. The interlayer insulation film 18 covers an entire area of the upper gate electrode 11 and covers a part (an upper gate electrode 11 side end portion) of the channel section 15. The interlayer insulation film 18 has a single layer structure of a silicon compound layer and specifically is a silicon oxide film or a silicon nitride (SiN) film. The source electrode 13 is included in the same layer as the source line SL. The source electrode 13 is branched from the source line SL and has an end portion that is connected to one end of the channel section 15. The source electrode 13 and the source line SL are formed from a multilayer metal film including metal films similar to the gate electrodes 11, 12 and the gate line GL and include a lower metal film made of titanium (Ti) and an upper metal film made of copper (Cu). The drain electrode 14 is opposite the source electrode 13 in the X-axis direction with a space of a channel length L of the channel section 15 and is connected to another end of the channel section 15. The drain electrode 14 is a multilayer metal film same as the source electrode 13.

According to this embodiment, if the scan signal transmitted through the gate line GL is supplied to the upper gate electrode 11 and the lower gate electrode 12, the image signal (charge) transmitted through the source line SL is moved from the source electrode 13 to the drain electrode 14 through the channel section 15 that is formed from the semiconductor material and thus the pixel electrode is charged. The upper gate electrode 11 and the lower gate electrode 12 overlap the channel section 15 and therefore, the drain current flowing through the channel section 15 is increased compared to a configuration in which only one gate electrode overlaps the channel section 15.

In this embodiment, as illustrated in FIG. 2, the lower gate insulation film 17 has a film thickness T1 that is greater than a film thickness T2 of the upper gate insulation film 16. The lower gate insulation film 17 has a multilayer structure including two silicon compound layers. Specifically, the lower gate insulation film 17 has a silicon nitride layer (SiN layer) 17A in a relatively lower layer and a silicon oxide layer (SiO$_2$ layer) 17B in a relatively upper layer. The silicon nitride layer 17A is a high dielectric constant insulation film having relatively high dielectric constant compared to that of the silicon oxide layer 17B. The silicon nitride layer 17A has a film thickness T3 that is relatively larger than a film thickness T4 of the silicon oxide layer 17B. The silicon oxide layer 17B is a low dielectric constant insulation film having relatively low dielectric constant compared to that of the silicon nitride layer 17A. The silicon oxide layer 17B has the film thickness T4 that is relatively smaller than the film thickness T3 of the silicon nitride layer 17A.

A width of the channel section 15 (a channel width) is referred to as "W", a length of the channel section 15 (a channel length) is referred to as "L", a voltage applied to the upper gate electrode 11 is referred to as "Vg", an electrostatic capacitance between the channel section 15 and the lower gate electrode 12 is referred to as "Cgi1", and an electrostatic capacitance between the channel section 15 and the upper gate electrode 11 is referred to as "Cgi2". A drain current "Id" flowing through the channel section 15 is represented by a following formula (1).

$$Id \approx W/2L \cdot Cgi2 \cdot Cgi2/(Cgi1+Cgi2) \cdot Vg^2 \quad (1)$$

The voltage applied to the lower gate electrode 12 is fixed as a premise and if a pinch-off point is near the drain electrode 14 on the channel section 15, a following formula (2) is satisfied. In the formula (2), "Vd" represents a drain voltage and "Vg1" represents a voltage applied to the lower gate electrode 12. By altering the formula (2), a formula (3) relating the drain voltage (3) is obtained.

$$Cgi1 \cdot (Vg1-Vd) + Cgi2/(Vg-Vd) = 0 \quad (2)$$

$$Vd = (Cgi1 \cdot Vg1 + Cgi2 \cdot Vg)/(Cgi1+Cgi2) \quad (3)$$

On the other hand, if a drain current generated by applying voltage to the lower gate electrode 12 is referred to as "Id1", a following formula (4) is satisfied. Similarly, if a drain current generated by applying voltage to the upper gate electrode 11 is referred to as "Id2", a following formula (5) is satisfied. If a drain current flowing through the channel section 15 is referred to as "Id", a following formula (6) is satisfied. If "Id1" obtained from the formula (4) and "Id2" obtained from the formula (5) are substituted into the formula (6), a following formula (7) is obtained. The formula (7) may be altered into a formula (8).

$$Id1 = W/L \cdot Cgi1 \cdot (Vg1 - \frac{1}{2} \cdot Vd) \cdot Vd \quad (4)$$

$$Id2 = W/L \cdot Cgi2 \cdot (Vg - \frac{1}{2} \cdot Vd) \cdot Vd \quad (5)$$

$$Id = Id1 + Id2 \quad (6)$$

$$Id = W/L \cdot Cgi1 \cdot (Vg1 - \frac{1}{2} \cdot Vd) \cdot Vd + W/L \cdot Cgi2 \cdot (Vg - \frac{1}{2} \cdot Vd) \cdot Vd \quad (7)$$

$$Id = W/L \cdot Vd \cdot (Cgi1 \cdot Vg1 + Cgi2 \cdot Vg - \frac{1}{2} \cdot Vd \cdot (Cgi1+Cgi2)) \quad (8)$$

A formula (9) is obtained by substituting the formula (3) into Vd included in the formula (8). A formula (10) is obtained by arranging the obtained formula (9). "Vg1" included in the formula (10) is constant and can be ignored and the above formula (1) is obtained.

$$Id = W/L \cdot (Cgi1 \cdot Vg1 + Cgi2 \cdot Vg)/(Cgi1+Cgi2) \cdot (Cgi1 \cdot Vg1 + Cgi2 \cdot Vg - \frac{1}{2} \cdot (Cgi1 \cdot Vg1 + Cgi2 \cdot Vg)) \quad (9)$$

$$Id = W/2L \cdot (Cgi1 \cdot Vg1 + Cgi2 \cdot Vg)^2/(Cgi1+Cgi2) \quad (10)$$

According to the formula (1), if each of the width "W" of the channel section 15, the length "L" of the channel section 15, and the voltage "Vg" applied to the upper gate electrode 11 is constant, a ratio of the electrostatic capacitance "Cgi2/(Cgi1+Cgi2)" dominantly influences the drain current "Id". The thickness T1 of the lower gate insulation film 17 is relatively greater than that of the upper gate insulation film 16 and therefore, the electrostatic capacitance "Cgi1" generated between the channel section 15 and the lower gate electrode 12 is smaller than the electrostatic capacitance "Cgi2" generated between the channel section 15 and the upper gate electrode 11. Accordingly, the ratio of the electrostatic capacitance "Cgi2/(Cgi1+Cgi2)" is increased and as a result, the drain current "Id" is further increased. Furthermore, as the film thickness T4 of the silicon oxide layer 17B that is the low dielectric constant insulation film is increased and the film thickness T3 of the silicon nitride layer 17A that is the high dielectric constant insulation film is decreased, the electrostatic capacitance "Cgi1" generated between the channel section 15 and the lower gate electrode 12 tends to be decreased. Therefore, the drain current "Id" can be further increased by controlling the ratio of the film thickness T3 of the silicon nitride layer 17A and the film thickness T4 of the silicon oxide layer 17B. The film thickness T4 of the silicon oxide layer 17B that is the low dielectric constant insulation film is relatively small and the film thickness T3 of the silicon nitride layer 17A that is the high dielectric constant insulation film is relatively great. Therefore, compared to the configuration having the film thicknesses with an opposite relation to the above-described one, the electrostatic capacitance "Cgi1" generated between the channel section 15 and the lower gate electrode 12 is increased. The silicon nitride layer 17A has a minute film structure compared to the silicon oxide layer 17B. Therefore, with the configuration that the film thickness T3 of the silicon nitride layer 17A is greater than the film thickness T4 of the silicon oxide layer 17B, a leak current is less likely to be generated between the channel section 15 and the lower gate electrode 12.

Figure 4:
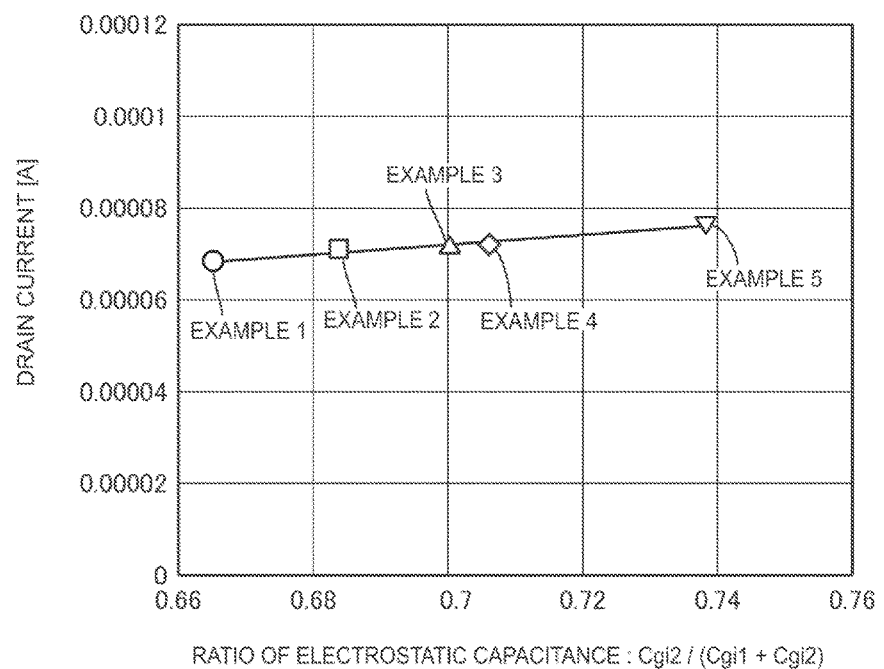
FIG. 4 is a graph illustrating experiment results of comparative experiment.

Comparative Experiment was performed to know how the ratio of the electrostatic capacitance "Cgi2/(Cgi1+Cgi2)" and the drain current "Id" are changed if the film thickness of the lower gate insulation film 17 is changed. Comparative Experiment includes following Examples 1 to 5. In Example 1, the film thickness T3 of the silicon nitride layer 17A included in the lower gate insulation film 17 is 325 nm and the film thickness T4 of the silicon oxide layer 17B is 50 nm. In Example 2, the film thickness T3 of the silicon nitride layer 17A is 275 nm and the film thickness T4 of the silicon oxide layer 17B is 100 nm. In Example 3, the film thickness T3 of the silicon nitride layer 17A is 225 nm and the film thickness T4 of the silicon oxide layer 17B is 150 nm. In Example 4, the film thickness T3 of the silicon nitride layer 17A is 325 nm and the film thickness 14 of the silicon oxide layer 17B is 100 nm. In Example 5, the film thickness T3 of the silicon nitride layer 17A is 325 nm and the film thickness T4 of the silicon oxide layer 17B is 150 nm. In Examples 1 to 5, the film thickness T2 of the upper gate insulation film 16 is fixed to 120 nm. In each of Examples 1 to 5, the ratio of the electrostatic capacitance "Cgi2/(Cgi1+Cgi2)" and the drain current "Id" are measured and the experiment results are illustrated in FIGS. 3 and 4. FIG. 3 is a table illustrating configurations of the gate insulation films 16, 17 (material and film thickness), the ratio of the electrostatic capacitance "Cgi2/(Cgi1+Cgi2)", and the drain current "Id" in each of Example 1 to Example 5. FIG. 4 is a graph representing the table in FIG. 3 and a lateral axis represents the ratio of the electrostatic capacitance "Cgi2/(Cgi1+Cgi2)" (no unit) and a vertical axis represents the drain current "Id" (unit is "A").

According to FIG. 3, in Example 1 to Example 3, the film thickness T1 of the lower gate insulation film 17 is constant (375 nm) and the ratio of the film thickness T3 of the silicon nitride layer 17A and the film thickness T4 of the silicon oxide layer 17B is changed. In Example 4, the film thickness T1 of the lower gate insulation film 17 is 425 nm and is greater than the film thickness T1 (375 nm) of the lower gate insulation film 17 in Example 1 to Example 3. In Example 5, the film thickness T1 of the lower gate insulation film 17 is 475 nm and is greater than the film thickness T1 (425 nm) of the lower gate insulation film 17 in Example 4. According to FIG. 4, comparing Example 1 to Example 3, Example 4, and Example 5, as the film thickness T1 of the lower gate insulation film 17 increases, the ratio of the electrostatic capacitance "Cgi2/(Cgi1+Cgi2)" increases. As the ratio of the electrostatic capacitance "Cgi2/(Cgi1+Cgi2)" increases, the drain current "Id" increases. In Comparative Experiment, the drain current "Id" is greatest in Example 5 including the greatest film thickness T1 of the lower gate insulation film 17. Such experiment results may be obtained because the ratio of the electrostatic capacitance "Cgi2/(Cgi1+Cgi2)" dominantly influences the drain current "Id" as illustrated in the formula (1).

Next, Example 1 to Example 3 including the same film thickness T1 (375 nm) are compared. Among Examples 1 to 3, in Example 1, the film thickness ratio of the silicon nitride layer 17A is 86.7%, which is highest, and the film thickness ratio of the silicon oxide layer 17B is 13.3%, which is lowest. In Example 3, unlike Example 1, the film thickness ratio of the silicon nitride layer 17A is 60.0%, which is lowest, and the film thickness ratio of the silicon oxide layer 17B is 40.0%, which is highest. According to FIGS. 3 and 4, as the film thickness ratio of the silicon nitride layer 17A decreases and the film thickness ratio of the silicon oxide layer 17B increases, the ratio of the electrostatic capacitance "Cgi2/(Cgi1+Cgi2)" increases and accordingly, the drain current "Id" also increases. Therefore, in Comparative Experiment, if the film thickness T1 of the lower gate insulation film 17 is constant, the drain current "Id" is greatest in Example 3 including the highest film thickness ratio of the silicon oxide layer 17B that is 40.0%. Such experiment results may be obtained due to following reasons. The dielectric constant of the silicon oxide layer 17B is lower than the dielectric constant of the silicon nitride layer 17A. Therefore, as the dielectric constant of the silicon oxide layer 17B increases, the electrostatic capacitance "Cgi1" generated between the channel section 15 and the lower gate electrode 12 is decreased and as a result, the ratio of the electrostatic capacitance "Cgi2/(Cgi1+Cgi2)" is increased.

As described before, the TFT (thin film transistor) 10 of this embodiment includes the channel section 15 formed from the semiconductor material, the source electrode 13 connected to one end of the channel section 15, the drain electrode 14 connected to another end of the channel section 15, the upper gate electrode 11 included in an upper layer than the channel section 15 and overlapping the channel section 15, the lower gate electrode 12 included in a lower layer than the channel section 15 and overlapping the channel section 15, the upper gate insulation film 16 that is between the upper gate electrode 11 and the channel section 15, and the lower gate insulation film 17 that is between the lower gate electrode 12 and the channel section 15 and having the film thickness T1 relatively greater than that of the upper gate insulation film 16.

According to such a configuration, if current is supplied to the upper gate electrode 11 and the lower gate electrode 12, charges move between the source electrode 13 and the drain electrode 14 through the channel section 15 that is formed from the semiconductor material. The upper gate electrode 11 and the lower gate electrode 12 overlap the channel section 15. With such a configuration, the drain current flowing through the channel section 15 is increased compared to a configuration in which only one gate electrode overlaps the channel section 15.

The width of the channel section 15 is referred to as "W", the length of the channel section 15 is referred to as "L", the voltage applied to the upper gate electrode 11 is referred to as "Vg", the electrostatic capacitance between the channel section 15 and the lower gate electrode 12 is referred to as "Cgi1", and the electrostatic capacitance between the channel section 15 and the upper gate electrode 11 is referred to as "Cgi2". The drain current "Id" flowing through the channel section 15 is represented by the formula of "Id≈W/2L·Cgi2·Cgi2/(Cgi1+Cgi2)·Vg$^2$". According to the formula, if each of the width "W" of the channel section 15, the length "L" of the channel section 15, and the voltage "Vg" applied to the upper gate electrode 11 is constant, a ratio of the electrostatic capacitance "Cgi2/(Cgi1+Cgi2)" dominantly influences the drain current "Id". The thickness T1 of the lower gate insulation film 17 is relatively greater than that of the upper gate insulation film 16 and therefore, the electrostatic capacitance "Cgi1" generated between the channel section 15 and the lower gate electrode 12 is smaller than the electrostatic capacitance "Cgi2" generated between the channel section 15 and the upper gate electrode 11. Accordingly, the ratio of the electrostatic capacitance "Cgi2/(Cgi1+Cgi2)" is increased and as a result, the drain current "Id" is further increased.

The lower gate insulation film 17 includes the low dielectric constant insulation film having a relatively low dielectric constant and the high dielectric constant insulation film having a relatively high dielectric constant. As the film thickness T4 of the low dielectric constant insulation film is increased and the film thickness T3 of the high dielectric constant insulation film is decreased, the electrostatic capacitance "Cgi1" generated between the channel section 15 and the lower gate electrode 12 tends to be decreased. Therefore, the drain current can be further increased by controlling the ratio of the film thickness T3 of the high dielectric constant insulation film and the film thickness T4 of the low dielectric constant insulation film.

The low dielectric constant insulation film is formed from the silicon oxide layer 17B having the relatively small film thickness T4 and the high dielectric constant insulation film is formed from the silicon nitride layer 17A having the relatively great film thickness T3. According to such a configuration, the film thickness T4 of the silicon oxide layer 17B that is the low dielectric constant insulation film is relatively small and the film thickness T3 of the silicon nitride layer 17A that is the high dielectric constant insulation film is relatively great. Therefore, compared to the configuration having the film thicknesses with an opposite relation, the electrostatic capacitance "Cgi1" generated between the channel section 15 and the lower gate electrode 12 is increased. Compared to the silicon oxide layer 17B, the silicon nitride layer 17A has a minute film structure. Therefore, with the configuration that the film thickness T3 of the silicon nitride layer 17A is greater than the film thickness 14 of the silicon oxide layer 17B, a leak current is less likely to be generated between the channel section 15 and the lower gate electrode 12.

The oxide semiconductor material is used as the semiconductor material. According to such a configuration, compared to a configuration including polysilicon as the semiconductor material, the charge mobility is lower. However, the drain current can be effectively increased by setting the film thickness T1 of the lower gate insulation film 17 greater than the film thickness T2 of the upper gate insulation film 16. Accordingly, the oxide semiconductor material can be used instead of polysilicon.

Second Embodiment

A second embodiment according to the present technology will be described with reference to FIG. 5. In the second embodiment, similar configurations, operations, and effects to the first embodiment will not be described.

Figure 5:
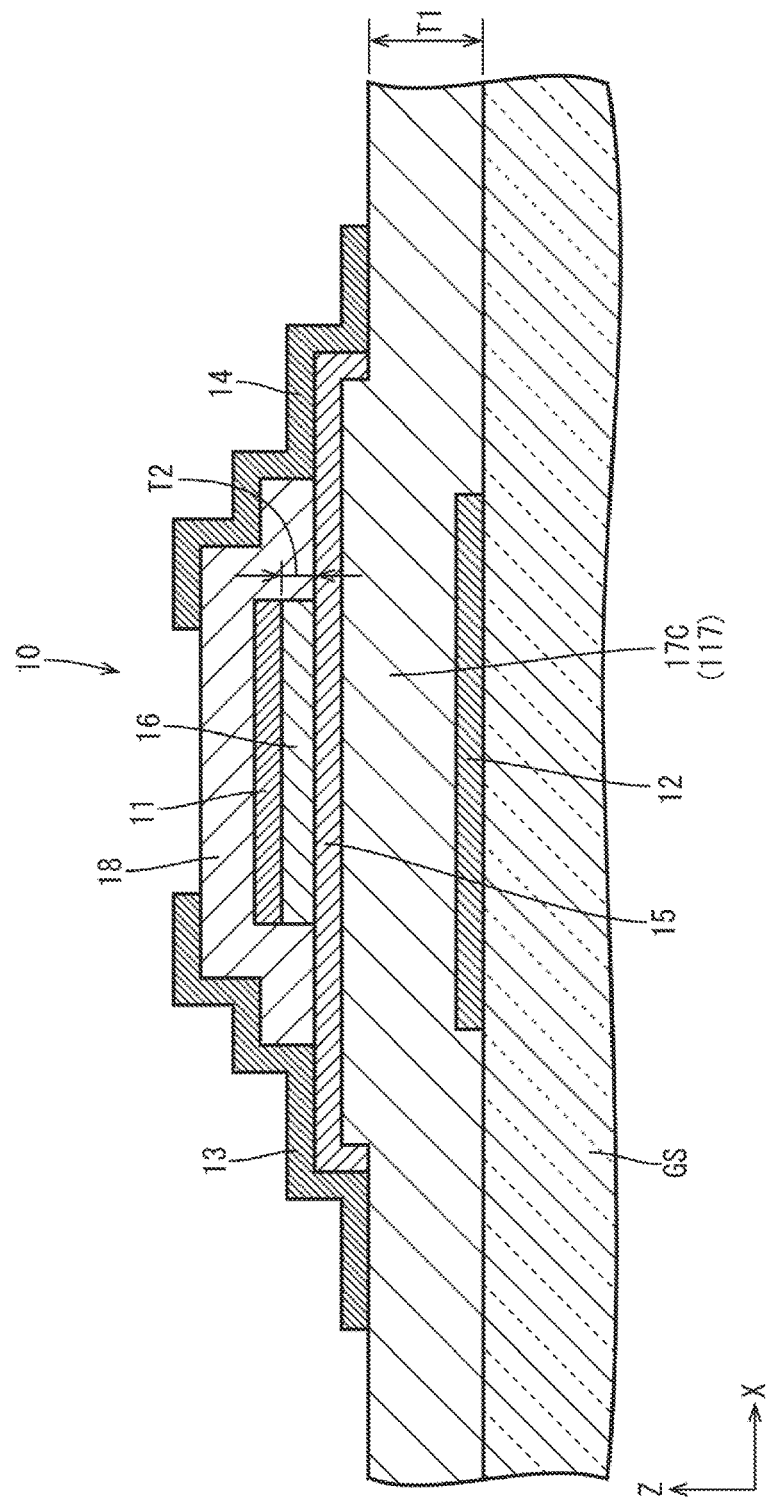
FIG. 5 is a cross-sectional view of a TFT according to a second embodiment of the present technology.

As illustrated in FIG. 5, the present embodiment includes a lower gate insulation film 117 that has a single layer structure of a silicon compound layer and specifically is formed from spin-on glass (SOG) film 17C. The SOG film 17C is formed by disposing liquid material, which is obtained by dissolving silicon oxide ($SiO_2$) in a solvent, on a glass substrate GS with a spin coating method. The SOG film 17C is generally used as a flattening layer and can be easily increased in film thickness thereof. The lower gate insulation film 117 is formed from the SOG film 17C and with such a configuration, the film thickness T1 of the lower gate insulation film 117 can be easily increased and it is preferable to increase the drain current "Id". The film thickness T1 of the SOG film 17C according to this embodiment is a total of the film thickness T3 of the silicon nitride layer 17A and the film thickness T4 of the silicon oxide layer 17B (see FIG. 2).

As described above, according to this embodiment, the lower gate insulation film 117 at least includes the SOG (spin-on glass) film 17C. According to such a configuration, the film thickness T1 of the lower gate insulation film 117 can be increased easily and it is preferable to increase the drain current.

Third Embodiment

A third embodiment according to the present technology described herein will be described with reference to FIG. 6. In the third embodiment, a lower gate insulation film 217 is altered from the second embodiment and has a multilayer structure. Similar configurations, operations, and effects to the second embodiment will not be described.

Figure 6:
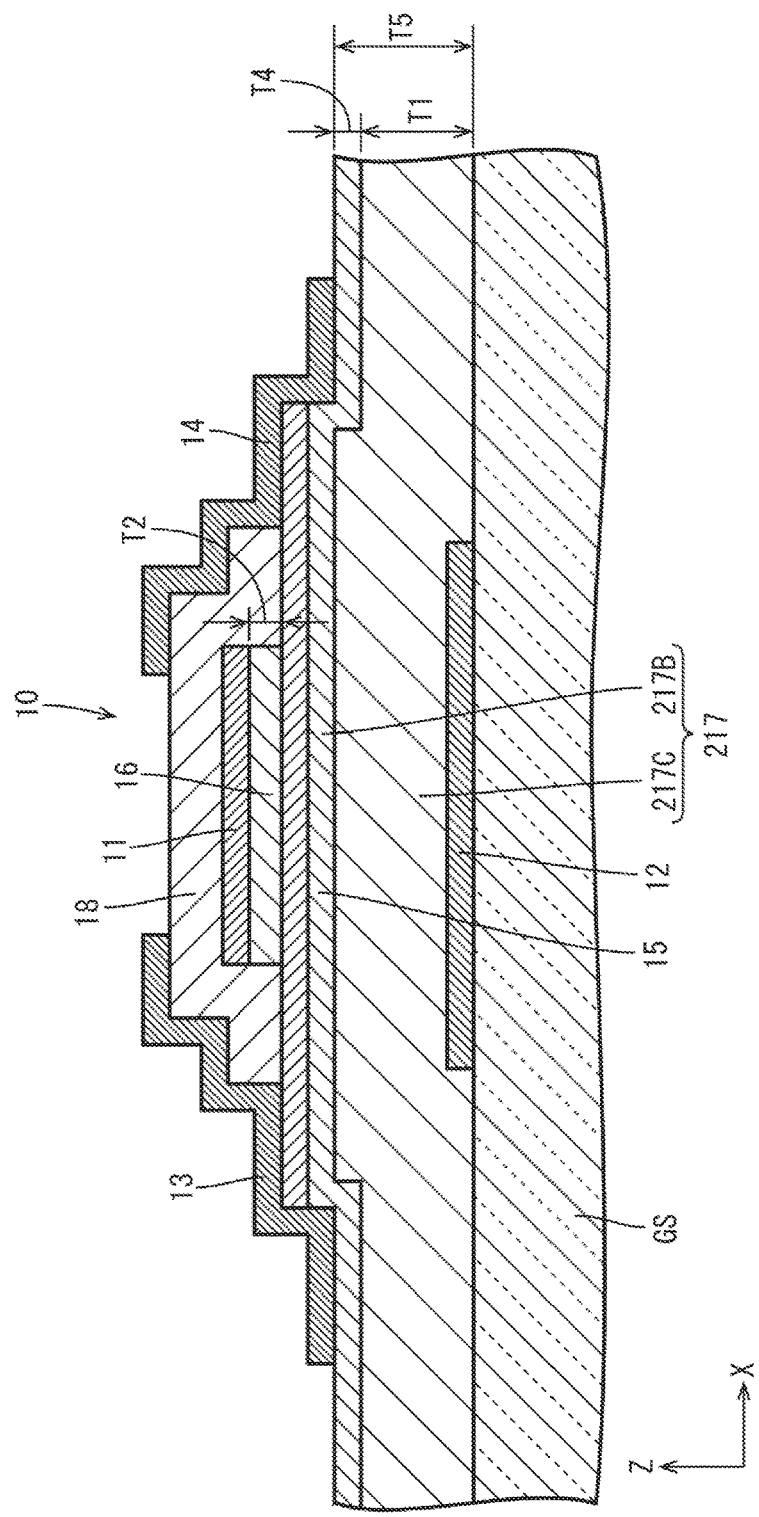
FIG. 6 is a cross-sectional view of a TFT according to a third embodiment of the present technology.

As illustrated in FIG. 6, the lower gate insulation film 217 of this embodiment has a multilayer structure including a SOG film 217C and a silicon compound layer. Specifically, the lower gate insulation film 217 includes a SOG film 217C that is included in a relatively lower layer and a silicon oxide layer 217B that is included in a relatively upper layer. According to such a configuration, a film thickness T5 of the lower gate insulation film 217 can be further increased and it is preferable to increase the drain current "Id".

As described above, according to this embodiment, the lower gate insulation film 217 includes the silicon oxide layer 217B that is a silicon compound layer in addition to the SOG film 217C. Accordingly, the lower gate insulation film 217 has a multilayer structure including the SOG film 217C and the silicon oxide layer 217B formed from the silicon compound layer such that the film thickness T5 of the lower gate insulation film 217 can be further increased and it is preferable to increase the drain current.

Fourth Embodiment

A fourth embodiment according to the present technology described herein will be described with reference to FIG. 7. In the fourth embodiment, a multilayer structure of a lower gate insulation film 317 is altered from that of the third embodiment. Similar configurations, operations, and effects to the third embodiment will not be described.

Figure 7:
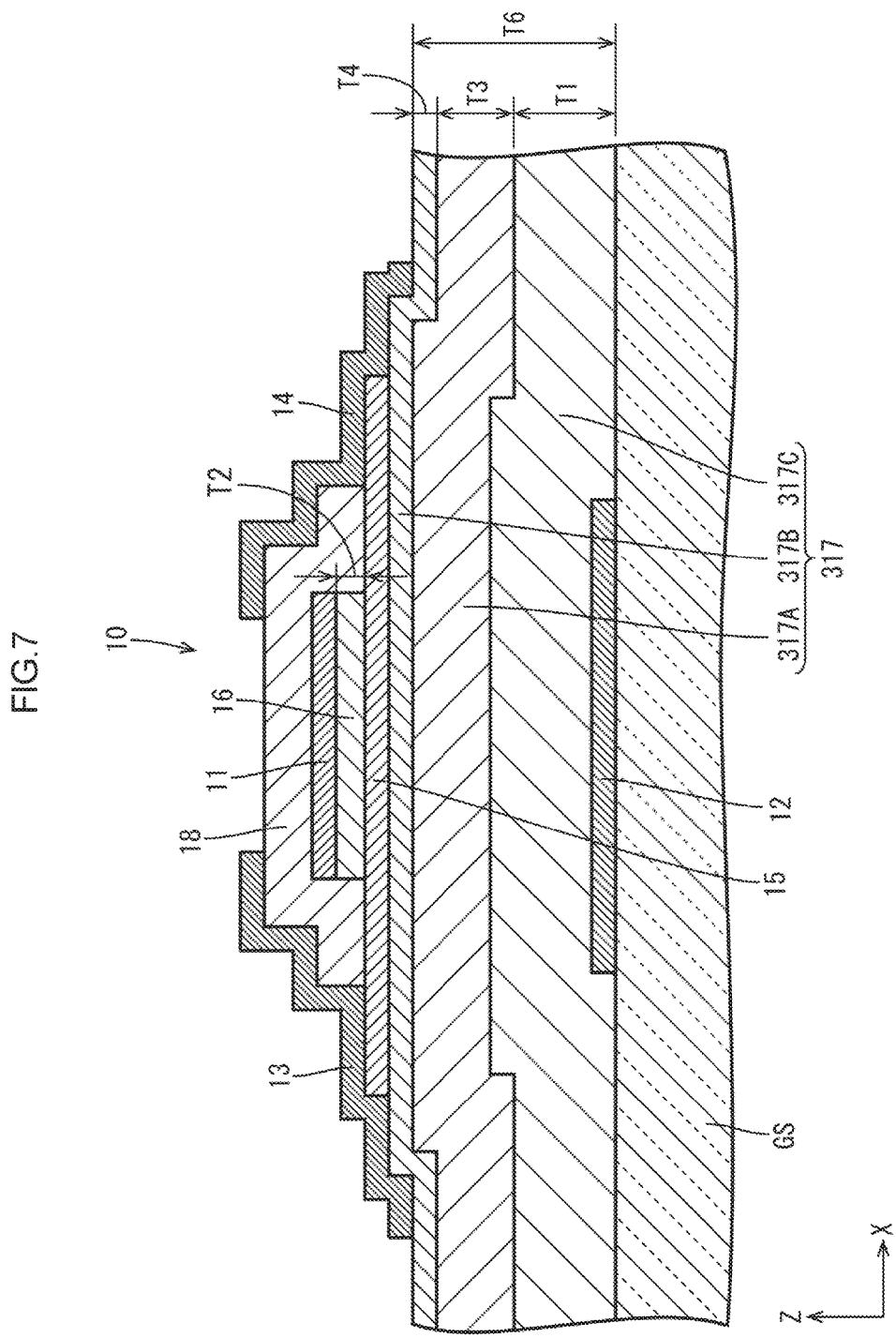
FIG. 7 is a cross-sectional view of a TFT according to a fourth embodiment of the present technology.

As illustrated in FIG. 7, the lower gate insulation film 317 of this embodiment includes a silicon nitride layer 317A in addition to a SOG film 317C and a silicon oxide layer 317B. Specifically, the lower gate insulation film 317 includes the SOG film 317C in a lowest layer, the silicon nitride layer 317A in a middle layer, and the silicon oxide layer 317B in a most upper layer. According to such a configuration, a film thickness T6 of the lower gate insulation film 317 can be further increased and it is preferable to increase the drain current "Id".

OTHER EMBODIMENTS

The present technology described herein is not limited to the embodiments described above and illustrated by the drawings. For examples, the following embodiments will be included in the technical scope.

(1) In the first embodiment, the lower gate insulation film includes the silicon nitride layer in the lower layer and includes the silicon oxide layer in the upper layer. However, the stacking order of the layers may be altered.

(2) In the third embodiment, the lower gate insulation film has a multilayer structure including the SOG film and the silicon oxide layer. However, the lower gate insulation film may have a multilayer structure including the SOG film and a silicon nitride layer.

(3) In the third embodiment, the lower gate insulation film includes the SOG film in the lower layer and includes the silicon oxide layer (the silicon compound layer) in the upper layer. However, the stacking order of the layers may be opposite.

(4) Other than the configuration described in the fourth embodiment, the specific stacking order of the SOG film, the silicon oxide layer, and the silicon nitride layer of the lower gate insulation film may be altered as appropriate.

(5) Other than each of the above embodiments, the silicon compound layer included in the lower gate insulation film may be altered as appropriate and a silicon oxynitride (SiON) film may be used.

(6) Other than each of the above embodiments, the silicon compound layer included in the upper gate insulation film may be altered as appropriate and a silicon oxynitride (SiON) film may be used.

(7) In each of the above embodiments, the source electrode and the drain electrode are included in an upper layer of the channel section. However, the source electrode and the drain electrode may be included in a lower layer of the channel section.

(8) In each of the above embodiments, each of the upper gate electrode and the lower gate electrode is formed from a multilayer metal film including two different kinds of metal material. However, each of the upper gate electrode and the lower gate electrode may be formed from a multilayer metal film including three or more different kinds of metal material. The specific metal material used for the upper gate electrode and the lower gate electrode may be titanium, copper or may be aluminum (Al) or molybdenum (Mo).

(9) In each of the above embodiments, the oxide semiconductor material is used as the semiconductor material of the channel section. However, amorphous semiconductor material may be used.

(10) In each of the above embodiments, the TFT included in the liquid crystal panel is described. However, a TFT included in a display panel such as an organic EL panel may be included in the scope of the present technology. Furthermore, a TFT included in a semiconductor device other than a display panel may be included in the scope of the present technology.

The invention claimed is:

1. A thin film transistor comprising:
a channel made of semiconductor material;
a source electrode connected to one end of the channel;
a drain electrode connected to another end of the channel;
an upper gate electrode included in an upper layer than the channel and overlapping the channel;
a lower gate electrode included in a lower layer than the channel and overlapping the channel;
an upper gate insulation film disposed between the upper gate electrode and the channel;
a lower gate insulation film disposed between the lower gate electrode and the channel and having a film thickness relatively greater than that of the upper gate insulation film; and
an interlayer insulation film on the channel and the upper gate electrode and defined in an island shape having an area in a plan view that is larger than an area of the upper gate electrode in the plan view.

2. The thin film transistor according to claim 1, wherein the lower gate insulation film at least includes a low dielectric constant insulation film and a high dielectric constant insulation film having dielectric constant higher than that of the low dielectric constant insulation film.

3. The thin film transistor according to claim 2, wherein the low dielectric constant insulation film is made of a silicon oxide layer and the high dielectric constant insulation film is made of a silicon nitride layer having a film thickness greater than that of the silicon oxide layer.

4. The thin film transistor according to claim 1, wherein the lower gate insulation film at least includes a spin-on glass (SOG) film.

5. The thin film transistor according to claim 4, wherein the lower gate insulation film includes a silicon compound film.

6. The thin film transistor according to claim 1, wherein the semiconductor material is an oxide semiconductor material.

7. The thin film transistor according to claim 1, wherein the source electrode and the drain electrode cover a portion of the interlayer insulation film and a portion of the channel.

* * * * *